US008847161B2

(12) United States Patent
Chang et al.

(10) Patent No.: US 8,847,161 B2
(45) Date of Patent: Sep. 30, 2014

(54) APPARATUS AND METHODS FOR CONTROLLING A LASER OUTPUT AND IMPROVING LASER SAFETY USING A PROXIMITY SENSOR

(75) Inventors: Yung Cheng Chang, Hsinchu (TW); E Min Chou, Hsinchu (TW); Yu Heng Jan, Hsinchu (TW)

(73) Assignee: Magnolia Source (Cayman) Limited, Grand Cayman (KY)

( * ) Notice: Subject to any disclaimer, the term of this patent is extended or adjusted under 35 U.S.C. 154(b) by 191 days.

(21) Appl. No.: 13/408,303

(22) Filed: Feb. 29, 2012

(65) Prior Publication Data

US 2013/0168551 A1   Jul. 4, 2013

(30) Foreign Application Priority Data

Dec. 29, 2011   (CN) .......................... 2011 1 0451785

(51) Int. Cl.
*H01L 31/16* (2006.01)
*G01J 5/10* (2006.01)
(52) U.S. Cl.
CPC ...................................... *H01L 31/16* (2013.01)
USPC ..................................... 250/338.1; 250/214.1
(58) Field of Classification Search
CPC .................................. H01L 31/16; G01J 5/10
USPC ........................................... 250/338.1, 214.1
See application file for complete search history.

(56) References Cited

U.S. PATENT DOCUMENTS

| 7,075,653 B1 * | 7/2006 | Rutherford .................... 356/437 |
| 2008/0083868 A1 * | 4/2008 | Wipiejewski et al. ......... 250/221 |
| 2008/0203280 A1 * | 8/2008 | Rizoiu et al. ............. 250/227.11 |

FOREIGN PATENT DOCUMENTS

CN   201053902 Y   4/2008

OTHER PUBLICATIONS

Chinese Office Action dated Oct. 29, 2012; Chinese Patent Application No. 201110451785.0; 4 pages; The State Intellectual Property Office of the P.R.C., Peoples Republic of China.
Xianping Yang and Akiteru Toyama; "Infrared Reflection Type Security-Monitoring Detector"; Espacenet; Chinese Publication No. CN 201053902 (Y); Publication Date: Apr. 30, 2008; 2 pages; Espacenet Database—Worldwide; http://worldwide.espacenet.com/.

* cited by examiner

*Primary Examiner* — David Porta
*Assistant Examiner* — Faye Boosalis
(74) *Attorney, Agent, or Firm* — Murabito, Hao & Barnes LLP; Andrew D. Fortney

(57) ABSTRACT

A laser output control method and a laser output control device, including a luminous source in the optical interface of an optical transceiver, a proximity detector configured to detect and capture reflection intensity of a luminous beam from the luminous source, an optical processing circuit electrically connected to the proximity detector and configured to receive and process the reflection intensity, and a microcontroller configured to capture parametric information of the reflection intensity, are disclosed. The microcontroller is also electrically connected to a laser driver, to receive parametric information of the optical processing circuit and to regulate the laser and/or laser driver activity based on the parametric information. The laser output control device may effectively restrict the laser output activity and the total laser output energy, which may prevent exposing human eyes to relatively strong laser energy and enhance the security of laser usage and protection for the human body.

20 Claims, 3 Drawing Sheets

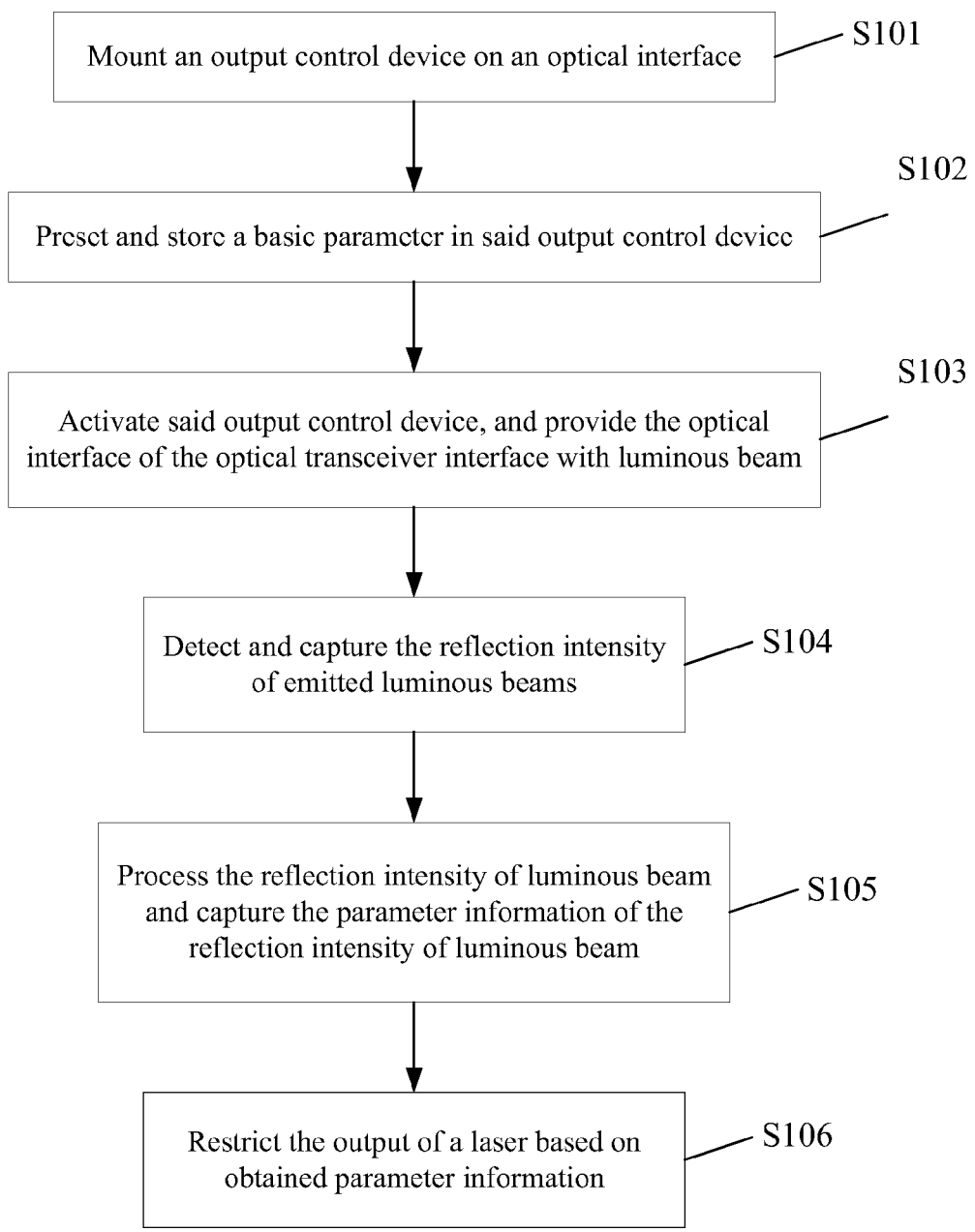

APPARATUS AND METHODS FOR CONTROLLING A LASER OUTPUT AND IMPROVING LASER SAFETY USING A PROXIMITY SENSOR

CROSS-REFERENCE TO RELATED APPLICATION

This application claims the benefit of Chinese Patent Application No. 201110451785.0, which was filed on Dec. 29, 2011, and is incorporated by reference as if fully set forth herein.

FIELD OF THE INVENTION

The present invention generally relates to the field of laser control, in particular to a method and device for controlling a laser output.

DISCUSSION OF THE BACKGROUND

As is well-known, when a laser is emitted from one optical transceiver and transmitted to another optical transceiver via a properly connected fiber, a completed communication mechanism and channel exists so that emitted laser can be conveyed properly. As is required by international laser safety standards, in order to prevent exposing the naked eye to laser leakage, the total output energy of the laser when a fiber is not connected needs to be efficiently regulated. Thus, when the fiber is connected to the optical transceiver interfaces on both sides, the laser beam can be properly conveyed as a defined energy request after a communication mechanism (or protocol) and channels between both sides are complete.

Currently, the total output of a laser is conventionally restricted by the handshake mode (e.g., the process of one device connecting with another device) between optical transceivers. The handshake mode between optical transceivers can be implemented in a plurality of ways. For instance, optical transmission(s) in N−1 channels between the optical transceivers are disabled, and only one channel stands by for the handshake mode, and after the handshake process is finished, then all of the channels are enabled for normal laser transmission. Different manufacturers provide different handshake modes and/or protocols. However, all of the various handshake modes or protocols have one fundamental issue, which is that the architecture can be realized generally only when the optical transceivers at the transmitting end and the receiving end are from the same manufacturer. The optical transceivers at the transmitting end and the receiving end must be informed of the mechanism of the handshake so that the handshake can be determined. However, with regard to the terminals in the handshake, this property is not described in any applicable multisource agreement (MSA). Thus, compatibility issues caused by handshake mechanisms exist in real world applications.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention is intended to provide a laser output control method and a device configured to control a laser output. In the present invention, the laser output activity and the total laser output energy can be effectively restricted to prevent the laser activity from emitting a relatively strong laser beam when the laser is not connected to a fiber, which can prevent human eyes from exposure to strong laser radiation, thus enhancing the security of laser usage and protection of the human body.

In one aspect, to realize the above-mentioned object(s), the present invention provides a laser output control device, comprising (i) a luminous source mounted in the optical interface of an optical transceiver and configured to work therein, (ii) a proximity detector configured to detect and capture the reflection intensity of the luminous beam from the luminous source at the optical interface, (iii) an optical processing circuit configured to be electrically connected to the proximity detector, and (iv) a microcontroller. The optical processing circuit has functionality to (a) receive and process the reflection intensity of the luminous beam captured by the proximity detector and (b) capture the parametric information of the reflection intensity of the luminous beam. The microcontroller is also configured to be electrically connected to a laser driver and to receive the parametric information from the optical processing circuit. Furthermore, the microcontroller effectively regulates the actions of the laser driver and the laser output based on the parametric information. Preferably, the luminous source comprises an infrared light emitting diode that emits infrared light.

According to further embodiments of the present invention, the laser output control device may further comprise an ambient light sensor electrically connected to the optical processing circuit and configured to (i) detect the intensity of the ambient light at the optical interface and (ii) transmit the detected intensity to the optical processing circuit.

According to one embodiment of the present invention, the optical processing circuit processes a basic parameter, such as the reflection intensity of the luminous beam from the luminous source, regardless of whether an optical fiber is in the optical interface or not.

According to another embodiment of the present invention, the optical transceiver interface has a via hole interconnecting with or in the optical interface, and the output control device is mounted in the via hole.

According to various embodiments of the present invention, the luminous source may be electrically connected to and driven by the optical processing circuit.

In another aspect, the present invention further provides a laser output control method, comprising: (1) mounting an output control device on or in an optical transceiver interface; (2) enabling the output control device, and transmitting a luminous beam to the optical interface; (3) detecting and capturing a reflection intensity of the luminous beam; (4) processing the reflection intensity of the luminous beam and capturing parametric information of the reflection intensity; and (5) regulating the output activity of the laser based on the captured parametric information.

Preferably, the laser output control method further comprises presetting and storing a basic parameter in the output control device.

According to some embodiments of the present invention, the basic parameter may be the reflection intensity of the luminous beam, regardless of whether an optical fiber is in the optical interface or not.

Relative to existing technologies, the present invention has advantages in that (i) the reflection intensity of the luminous beam from the luminous source can be detected by the proximity detector, in which the detected reflection intensity can be transmitted to the optical processing circuit, (ii) the microcontroller can be utilized to determine whether a fiber is connected to the optical interface based on the processing result of the optical processing circuit, and (iii) the laser output and the total laser output energy can be restricted, which may prevent harmful exposure of human eyes to relatively strong laser light or radiation when a fiber is not inserted into a transceiver. Thus, the present invention advantageously enhances the security of laser usage and provides protection for the user's eyes.

These and other advantages of the present invention will become readily apparent from the detailed description of various embodiments below.

BRIEF DESCRIPTION OF THE DRAWINGS

In order to describe embodiments of the present invention or the technical proposals in accordance with existing technology more clearly, the drawings utilized in the descriptions of the embodiments or of existing technology will be illustrated sparingly. The drawings show only some embodiments of the present invention. Without creative contribution, one skilled in the art also can utilize these drawings to obtain other embodiments.

FIG. 5 is a flow chart of a laser output control method in accordance with the present invention.

DETAILED DESCRIPTION

Figure 1:
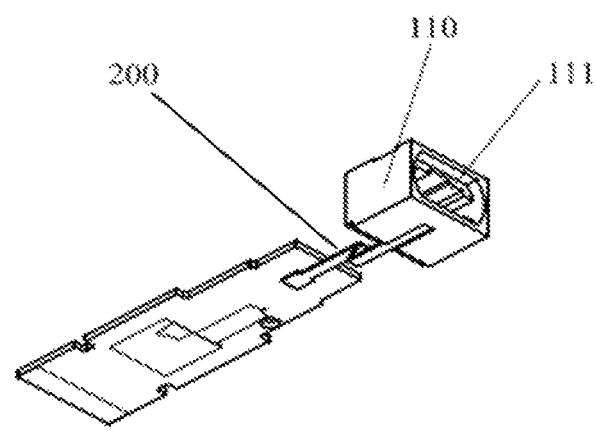
FIG. 1 is a diagram showing a laser output control device and an optical transceiver interface in accordance with the present invention.

The present invention will become readily apparent from the detailed description of embodiments and drawings below.

Reference will now be made in detail to various embodiments of the invention, examples of which are illustrated in the accompanying drawings. The technical proposal(s) of embodiments of the present invention will be fully and clearly described in conjunction with the drawings. In the following embodiments, it will be understood that the descriptions are not intended to limit the invention. Based on the described embodiments of the present invention, other embodiments obtained by one skilled in the art without creative contribution are considered in the scope of legal protection given to the present invention. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. The embodiments described here are only used to explain, rather than limit, the invention.

For the sake of convenience and simplicity, the terms "luminous beam," "optical signal," "radiation," and "light" may be used interchangeably, as may the terms "connected to," "coupled with," "coupled to," and "in communication with" (which terms also refer to direct and/or indirect relationships between the connected, coupled and/or communicating elements unless the context of the term's use unambiguously indicates otherwise), but these terms are generally given their art-recognized meanings.

Furthermore, all characteristics, measures or processes disclosed in this document, except characteristics and/or processes that are mutually exclusive, can be combined in any manner and in any combination possible. Any characteristic disclosed in the present specification, claims, Abstract and/or figures can be replaced by other equivalent characteristics or characteristics with similar objectives, purposes and/or functions, unless specified otherwise. Each characteristic is generally only an embodiment of the invention disclosed herein.

The present laser output control device pertains to various optical transceivers and can be utilized to regulate laser output between optical transceivers. The optical transceiver interface of the optical transceiver can be affixed to or mounted on the output port of a laser so that laser transmission between the optical transceiver and other devices can work properly.

Figure 2:
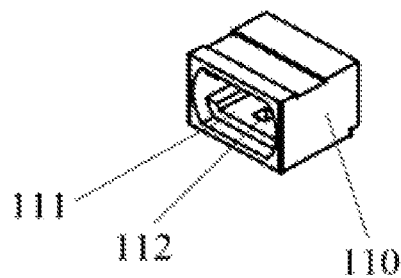
FIG. 2 is a diagram of an optical interface.

Referring to FIGS. 1 and 2, an optical transceiver interface 110 has an optical interface 111 to connect one or more exterior optical fibers, over which the laser can receive or transmit optical signals properly. One end (e.g., face) of the optical transceiver interface 110 has a via hole 112 (shown in FIG. 2), interconnected to the optical interface 111. An output control device 200 (FIG. 1) is partly mounted within or inserted into the via hole 112, through which the output control device 200 is connected to the optical interface 111. Also, the output control device 200 is electrically connected to a laser driver 120 via a microcontroller 240, shown in FIG. 3.

Figure 3:
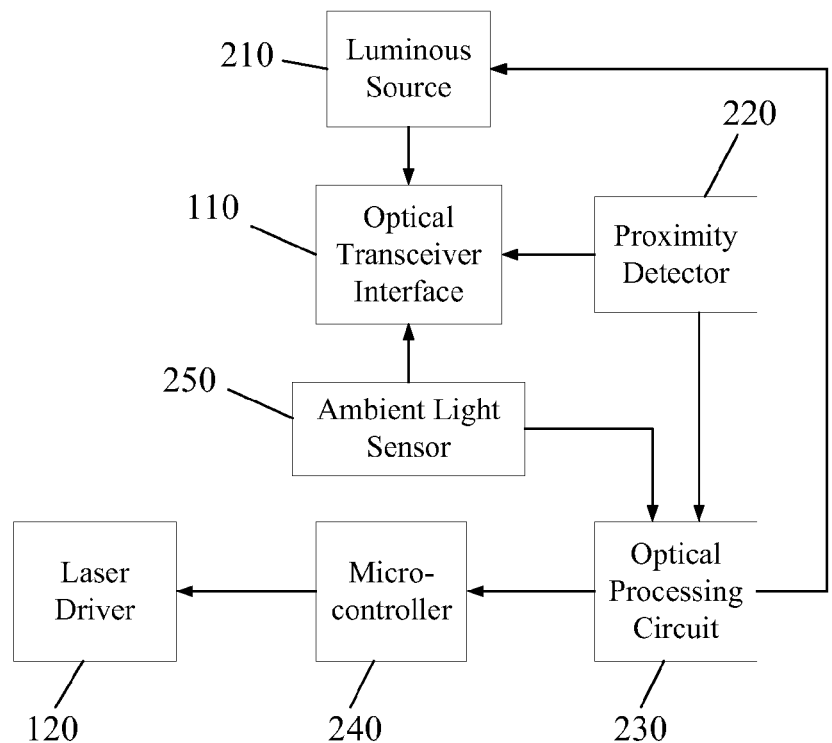
FIG. 3 is a diagram showing a laser output control device in accordance with the present invention.
Figure 4:
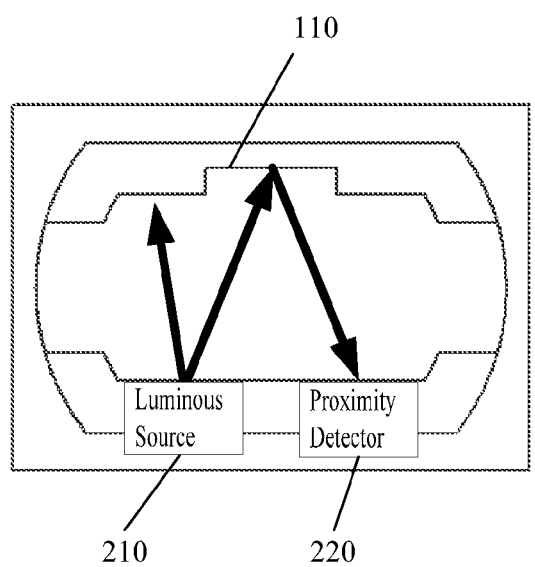
FIG. 4 is a diagram of a luminous source and a proximity detector in accordance with the present invention.

Referring to FIGS. 3 and 4, the output control device comprises a luminous source (e.g., infrared light emitting diode) 210, a proximity detector 220, an optical processing circuit 230, and a microcontroller 240. The luminous source 210 is mounted within the via hole 112 (FIG. 2) in the optical transceiver interface 110. The luminous source 210 also provides the optical interface 111 of the optical transceiver interface 110 with a luminous (e.g., light or laser) beam. In embodiments of the present invention, the luminous source 210 may be an infrared light emitting diode that provides the optical interface 111 with infrared light. However, the present disclosure is not intended to limit the luminous source 210 to an infrared light emitting diode. The proximity detector 220 is also mounted within via hole 112 (FIG. 2) in the optical interface 111.

As shown in FIG. 4, the luminous source 210 provides the optical interface 111 of FIG. 2 with infrared light, which may be projected to an interior wall of the optical interface 111 and is subsequently reflected to the proximity detector 220. Thus, the proximity detector 220 can detect a reflection intensity of the infrared light and obtain a detection result. The reflection intensity of the infrared light detected by the proximity detector 220 when a fiber is inserted into the optical interface 111 is greater than that when the fiber is not inserted into the optical interface 111. When a fiber is inserted into an optical interface 111 of FIG. 2, the optical reflection distance of the infrared light becomes shorter, and thus, the intensity of its reflected light becomes greater.

The optical processing circuit 230 is electrically connected to the proximity detector 220 and the microcontroller 240, respectively, so that the detection results obtained by the proximity detector 220 can be transmitted to the microcontroller 240 after being analyzed and processed by the optical processing circuit 230. In addition, regardless of whether a fiber is inserted into optical interface 111 or not, the reflection intensity of the infrared light at the optical interface 111 may be preset and stored in the optical processing circuit 230 as a basic parameter. The reflection intensity can be stored either with a fiber inserted into the optical interface 111 or without. In the case where the reflection intensity of the infrared light when a fiber is inserted into the optical interface 111 is taken as a basic parameter, the optical processing circuit 230 will compare the reflection intensity of infrared light at the optical interface 111 with the preset basic parameter. If the actual parameter is less than the basic parameter, then the optical processing circuit 230 concludes that a fiber has not been inserted into the optical interface 111. Certain parametric information of the reflection intensity of the infrared light can be obtained from the optical processing circuit 230.

Accordingly, if the actual parameter is greater than or equal to the basic parameter in the case where the reflection intensity of the infrared light when a fiber is inserted into the optical interface 111 is taken as the basic parameter, the optical processing circuit 230 concludes that a fiber is inserted into the optical interface 111. In addition, the optical processing circuit 230 is also electrically connected to the luminous source 210 to drive the luminous source 210. The microcontroller 240 is electrically connected to the optical processing circuit 230 and the laser driver 120, respectively, and is configured to (i) receive the parametric information obtained from the optical processing circuit 230 and (ii) manage the laser driver 120 based on the obtained parametric information. Specifically, when the received parametric information indicates that a fiber has not been inserted into the optical interface 111, the microcontroller 240 deactivates the laser driver 120 or decreases the output of the luminous source 210 (e.g., by reducing a bias current provided to the laser) to protect exposed or unprotected eyes. Also, when the received parametric information indicates that a fiber is inserted into the optical interface 111, the microcontroller 240 activates the laser driver 120 to operate in a normal mode for laser transmission.

In addition, in an exemplary embodiment of the present invention, the output control device 200 further comprises an ambient light sensor 250 electrically connected to the microcontroller 240 via the optical processing circuit 230. When the luminous source 210 or the proximity detector 220 does not work properly (e.g., by accident or malfunction), the ambient light sensor 250 can work with other devices to restrict the laser output as an alternative scheme for controlling laser output energy by the output control device 200. The ambient light sensor 250 is configured to detect and determine the optical intensity where the optical interface 111 is located, and then transmit an obtained detection result to the microcontroller 240 via the optical processing circuit 230. Furthermore, when the ambient light sensor 250 is in use, the light intensity within the optical interface 111 when a fiber is inserted into the optical interface 111 may be preset and stored in the optical processing circuit 230 as a basic parameter. The other detailed actions of the ambient light sensor 250 working with the optical processing circuit 230 and the microcontroller 240 to manage the laser driver 120 are the same as previously discussed for the proximity detector 220.

FIG. 5 is a flow chart showing an output control method of the present invention. As shown, the laser output control method includes the steps discussed in further detail below.

S101: the output control device 200 may be mounted on or otherwise attached or affixed to the optical interface 111. In S101, the output control device 200 is mounted within the optical transceiver interface 110 of an optical transceiver so that the reflection intensity within the optical interface 111 can be easily detected and determined by the output control device 200.

S102: a basic parameter (or parametric value) is preset and stored in the output control device 200. In S102, the basic parameter is stored in the optical processing circuit 230 of the output control device 200, and subsequently, the optical processing circuit 230 analyzes and processes the variously obtained parametric information and transmits the information to a microcontroller 240. Subsequently, the microcontroller 240 can manage a laser driver 120 based on the analysis and/or processing results to regulate the energy intensity or status of the laser output. Furthermore, the basic parameter (or preset value) is the light reflection intensity obtained after the fiber is inserted into the optical interface (or, alternatively, when the fiber is not inserted), so all the subsequent specific control commands of the microcontroller 240 are executed based on results obtained by comparing actual light reflection intensity obtained with the basic parameter value stored in the optical processing circuit 230.

S103: the output control device 200 is activated, and the optical interface 111 of the optical transceiver interface 110 is provided with a luminous beam. In S103, the luminous source (e.g., infrared light emitting diode) of the output control device 200 is configured to provide the optical interface 111 with the luminous beam, which is reflected from an interior wall of the optical interface 111 so that the subsequent steps for detecting the intensity of the reflected light can go smoothly. In addition, in an exemplary embodiment of the present invention, the luminous beam may be infrared light.

S104: the reflection intensity of emitted luminous beams is detected and captured. In S104, via the optical interface 111, the luminous beam is reflected to the proximity detector 220 configured to detect light reflection intensity and to transmit the intensity to the optical processing circuit 230. Alternatively, the ambient light sensor 250 detects and/or determines the optical intensity at the optical interface 111, then transmits a detection result to the microcontroller 240 via the optical processing circuit 230.

S105: the reflection intensity of the luminous beam is processed and the parametric information of the reflection intensity of the luminous beam is captured. In S105, the optical processing circuit 230 is configured to receive and analyze the light reflection intensity from the proximity detector 220 or ambient light sensor 250. Specifically, if the reflection intensity of the laser energy when a fiber has been inserted into the optical interface is taken as a basic parameter, the optical processing circuit 230 will compare the reflection intensity at the optical interface 111 with the preset basic parameter. If the actual parameter value is less than the basic parameter value, the optical processing circuit 230 concludes that a fiber is not inserted into the optical interface 111. Certain parametric information of the reflection intensity of the infrared light can be obtained from the optical processing circuit 230. Accordingly, if the actual parameter is greater than or equal to the basic parameter in the case where the reflection intensity of the infrared light when a fiber is inserted into the optical interface 111 is taken as the basic parameter, the optical processing circuit 230 concludes that a fiber is inserted into the optical interface. In addition, the optical processing circuit 230 is configured to transmit the obtained parametric information to the microcontroller 240 for further processing.

S106: the output of the laser is controlled (e.g., restricted), based on the obtained parametric information. In S106, the microcontroller 240 is configured to (i) receive the parametric information obtained from the optical processing circuit 230 and (ii) manage the laser driver based on the obtained parametric information. Specifically, when the received parametric information indicates that a fiber has not been inserted into the optical interface 111, the microcontroller 240 deactivates the laser driver 120 or decreases the output of the laser to protect exposed or unprotected eyes. Also, when the received parametric information indicates that a fiber is inserted into the optical interface 111, the microcontroller 240 activates the laser driver 120 to operate in a normal mode for laser transmission.

As mentioned above, the present laser output control method and apparatus can be utilized to control the laser output activity and/or the total output energy of the laser in an optical transceiver, based on the variance of the reflection intensity of the luminous beam in or passing through the optical interface 111 as a function of whether a fiber is or is not inserted at the optical interface 111 of the optical transceiver interface 110. By presetting a basic parameter value in the output control device 200 and comparing the reflection intensity of the luminous beam with the basic parameter value in real time, the operation of a laser driver can be regulated in real time so that a laser works properly when a fiber is properly inserted in the optical interface, and harmful exposure to human eyes from relatively strong laser radiation from a laser is prevented when a fiber is not inserted in the optical interface 111. Thus, the present invention advantageously enhances the security of laser usage and provides protection for the human body. The laser output control method and the apparatus regulating the operation of the laser driver can work without a handshake mode or protocol, so that a requirement for the consistency of the optical transceiver at both ends of a laser transmission medium (e.g., fiber optic cable) and compatibility issues between different transceivers can be ignored. Therefore, the present laser output control method and apparatus has a broader usable range and higher generality.

The present invention is not restricted to the above-mentioned embodiments. The present invention can be expanded to any new features or any new combination thereof, as well as any new procedure, method, or new combination thereof described in the present specification.

The foregoing descriptions of specific embodiments of the present invention have been presented for purposes of illustration and description, and many modifications and variations are possible in light of the above teachings. The descriptions are not intended to limit the invention to the above described embodiments. On the contrary, the invention is intended to cover new feature or any combination thereof, as well as steps of any new method or procedure, or any new combination thereof that may be included within the spirit and scope of the specification. The embodiments were chosen and described in order to best explain the principles of the invention and its practical application, to thereby enable others skilled in the art to best utilize the invention and various embodiments with various modifications as are suited to the particular use contemplated. It is intended that the scope of the invention can be defined by the Claims appended hereto and their equivalents.

What is claimed is:

1. A laser output control device, comprising:
   a luminous source in an optical interface of an optical transceiver and configured to work therein;
   a proximity detector configured to detect and capture a reflection intensity of a luminous beam from said luminous source;
   an optical processing circuit configured to be electrically connected with said proximity detector, said optical processing circuit configured to receive and process said reflection intensity of said luminous beam captured by said proximity detector; and
   a microcontroller configured to receive parametric information from said optical processing circuit and decrease an output of said luminous source when said parametric information indicates that an optical medium is not in said optical interface.

2. The laser output control device of claim 1, wherein said parametric information includes parametric information of said reflection intensity, and said optical processing circuit is configured to capture said parametric information of said reflection intensity of said luminous beam.

3. The laser output control device of claim 2, further comprising a laser driver electrically connected to said microcontroller.

4. The laser output control device of claim 1, wherein said microcontroller is configured to regulate activity of said laser driver and/or an output of said luminous source based on the parametric information.

5. The laser output control device of claim 1, wherein said luminous source comprises an infrared light emitting diode that emits infrared light.

6. The laser output control device of claim 1, wherein said luminous source comprises a laser.

7. The laser output control device of claim 1, further comprising an ambient light sensor electrically connected to said optical processing circuit.

8. The laser output control device of claim 7, wherein said ambient light sensor is configured to detect an intensity of ambient light at said optical interface and to transmit the detected ambient light intensity to said optical processing circuit.

9. The laser output control device of claim 1, wherein said optical processing circuit contains a preset value of the reflection intensity of the luminous beam from said luminous source when an optical fiber is either (i) inserted in said optical interface or (ii) not inserted in said optical interface.

10. The laser output control device of claim 1, wherein said optical transceiver comprises a via hole connected to said optical interface, and said output control device is in said via hole.

11. The laser output control device of claim 1, wherein said luminous source is electrically connected to and driven by said optical processing circuit.

12. A method of controlling an output of a laser, comprising:
    placing an output control device on or in an optical transceiver interface;
    transmitting a luminous beam to an optical interface operably connected to the optical transceiver interface;
    detecting and capturing a reflection intensity of the transmitted luminous beam;
    processing and/or determining the reflection intensity of the luminous beam; and
    decreasing output activity of the laser when parametric information indicates that an optical medium is not in said optical interface.

13. The method of claim 12, further comprising storing a basic parameter value in said output control device.

14. The method of claim 13, wherein said basic parameter value is the reflection intensity of the luminous beam from said luminous source when an optical fiber is either (i) inserted in said optical interface or (ii) not inserted in said optical interface.

15. The method of claim 14, wherein processing the reflection intensity comprises comparing an actual light reflection intensity with the basic parameter value.

16. The method of claim 15, wherein:
a) when said basic parameter value is the reflection intensity of the luminous beam from said luminous source when said optical fiber is inserted in said optical interface, the reflection of the luminous beam indicates that a fiber is inserted into the optical interface when an actual parameter value is greater than or equal to the basic parameter value, and the fiber is not inserted into the optical interface when the actual parameter value is less than the basic parameter value; and
b) when said basic parameter value is the reflection intensity of the luminous beam from said luminous source when said optical fiber is not inserted in said optical interface, the reflection of the luminous beam indicates that a fiber is inserted into the optical interface when an actual parameter value is greater than the basic parameter value, and the fiber is not inserted into the optical interface when the actual parameter value is less than or equal to the basic parameter value.

17. The method of claim 15, wherein regulating the output activity of the laser comprises (i) deactivating a laser driver corresponding to the laser or decreasing the laser output when received parametric information indicates that a fiber has not been inserted into the optical interface, and (ii) activating the laser driver to operate in a normal mode for laser transmission when the received parametric information indicates that a fiber is inserted into the optical interface.

18. The method of claim 12, further comprising analyzing obtained parametric information and transmitting the parametric information to said microcontroller.

19. The method of claim 12, wherein regulating the output activity comprises controlling a laser driver to regulate an energy intensity or status of the laser.

20. The method of claim 12, wherein detecting the reflection intensity of the luminous beam comprises receiving (i) a reflection of the luminous beam in a proximity detector or (ii) ambient light from an ambient light sensor.

* * * * *